United States Patent
Hiatt et al.

[19]

[11] Patent Number: 5,966,635
[45] Date of Patent: Oct. 12, 1999

[54] METHOD FOR REDUCING PARTICLES ON A SUBSTRATE USING CHUCK CLEANING

[75] Inventors: W. Mark Hiatt, Austin; Karl Emerson Mautz, Round Rock, both of Tex.

[73] Assignee: Motorola, Inc., Schaumburg, Ill.

[21] Appl. No.: 08/791,970

[22] Filed: Jan. 31, 1997

[51] Int. Cl.⁶ .............................. B08B 3/00; B08B 3/02; B08B 3/04
[52] U.S. Cl. ...................... 438/905; 134/104.1; 134/153; 134/157
[58] Field of Search .................. 438/905; 134/104.1, 134/153, 157

[56] References Cited

U.S. PATENT DOCUMENTS

| | | | |
|---|---|---|---|
| Re. 31,053 | 10/1982 | Firtion et al. ............................. | 355/77 |
| 4,518,678 | 5/1985 | Allen ....................................... | 430/311 |
| 4,788,994 | 12/1988 | Shinbara ................................. | 134/157 |
| 4,855,775 | 8/1989 | Matsuoka ................................ | 134/153 |
| 4,886,728 | 12/1989 | Salamy et al. .......................... | 438/905 |
| 5,001,084 | 3/1991 | Kawai et al. ............................ | 437/231 |
| 5,032,217 | 7/1991 | Tanaka .................................... | 134/153 |
| 5,626,675 | 5/1997 | Sakamoto et al. ..................... | 134/902 |

*Primary Examiner*—Benjamin Utech
*Assistant Examiner*—Lynette T. Umez-Eronini
*Attorney, Agent, or Firm*—Patricia S. Goddard

[57] ABSTRACT

Particles counts and concentrations are reduced from the backside of a substrate, such as a semiconductor wafer or flat panel display with the invention, to improve precision and uniformity in subsequent operations, including lithography operations. A semiconductor substrate is placed on a chuck (10) in a track system (30), such as a resist coater, a developer, or other form of spin coater. The substrate is processed accordingly to conventional practice and the substrate is removed. The chuck is then cleaned by dispensing a solvent, for example using EGMEA or PGMEA, through a dispense nozzle (38) of the system. Alternatively, or additionally, a brush (36) or sponge which is at least partially saturated with a solvent (39) is moved across the chuck to remove particles. The chuck cleaning can occur between every wafer, every wafer lot, or less periodically, such as between shifts, as the chuck particle accumulation dictates.

29 Claims, 3 Drawing Sheets

METHOD FOR REDUCING PARTICLES ON A SUBSTRATE USING CHUCK CLEANING

FIELD OF THE INVENTION

The present invention relates generally to methods for reducing contaminant particles on substrates, such as semiconductor wafers and flat panels displays.

BACKGROUND OF THE INVENTION

In forming semiconductor devices, substrates typically are processed through a number of different pieces of equipment, including resist coating and developing tracks. As the substrates are processed through the equipment, particles from the equipment chucks can accumulate on the backsides of the substrates. These particles can cause problems in subsequent processing steps, including lithography or other imaging steps. Depth of focus in lithography is critical. The particles on the backside of a substrate can cause a substrate to bow beyond the depth of focus as vacuum is applied.

FIG. 1 and FIG. 2 can be referenced to better understand the above particle problem. FIG. 1 is a top view of a chuck 10 which is typical of those currently used in semiconductor substrate handling equipment, such as track systems. Chuck 10 includes a plurality of raised portions in the form of concentric rings 12, a vacuum port 14, and a plurality of recessed vacuum channels 16. A substrate (not shown) is positioned on the chuck, ideally centered, and a vacuum is applied through vacuum port 14. Segmented vacuum channels 18 connect the concentric vacuum channels 16, and enable a vacuum to be drawn with adjacent concentric rings 12 by a single, centralized vacuum port 14. Once vacuum is applied, the substrate is processed. For example, a resist is dispensed on the substrate and spun on the chuck to fully coat the front side of the substrate. During the spin cycle, particles of resist are generated and become suspended in the air around the wafer due to turbulence of air flow within a spinner cup of the spin track system. These particles eventually build up on the chuck, particularly during the period between removing the substrate from the chuck and positioning the next substrate on the chuck.

FIG. 2 is a representation of a typical particle distribution on the backside of a semiconductor substrate 20 when using the chuck illustrated in FIG. 1 in a resist coater. Particles 22 correspond to isolated particles which are not introduced as a result of using chuck 10, but simply are the result of particles landing on the backside of the substrate while the substrate is mounted on the chuck. Particles 24 correspond to the outer edge of the chuck, and particles 26 correspond to the inner concentric rings 12 of the chuck. (It is noted that in FIG. 2 the size of chuck 10 is smaller than as illustrated in FIG. 1. In practice, the substrate is likely to be quite a bit larger than the chuck holding the substrate.) As is evident from FIG. 2, the most dense particle distribution corresponds to the raised areas of the chuck (i.e. those portions of the chuck in direct contact with the substrate, such as raised portions 12 which separate adjacent concentric vacuum channels 16). In these areas, the particle density will likely lead to subsequent processing problems due to the severity of bowing of the substrate once mounted on another chuck.

One prior art attempt to solve the problem of backside particles uses an edge bead removal system. However, edge bead removal typically does not remove particles that are introduced onto the substrate by the chuck. In edge bead removal processes, typically a solvent is directed to the edge of the substrate to remove resist on or near the edge of the substrate. In some edge bead removal processes, the solvent is also directed to the backside of the substrate near the edge. However, when directing the solvent to the substrate backside, the area of the backside of the substrate in contact with the chuck and the area immediately surrounding the chuck cannot be exposed to the solvent and thus is not cleaned.

Another prior art attempt to solve the problem is to mismatch or offset the contact areas between the chuck and the substrate in subsequent processing steps. For example, the contact area pattern for a chuck in a resist coater is made to be different than the contact area pattern for a chuck in a stepper. Particles on the backside of the substrate as a result of resist coating are thus designed to lie within vacuum channels of the chuck in the stepper. However, even optical inspection methods cannot always confirm if the positioning of the particles are within a "safe" area for chucks used in subsequent processing or if the density of particles is acceptable.

Still another attempt to fix the particle problem is the use of pin chucks at processing steps subsequent to the processing step wherein the particles are introduced onto the backside of the substrate. Although the amount of surface contact between the pin chuck and the substrate is reduced, there still can be a location where the pin chuck contacts a particle on the backside of the wafer. Over time particles can accumulate on the pins and require cleaning. The cleaning of a pin chuck is difficult due to the number of pins. Cleaning of the pins can also affect pin planarity, leading to critical substrate focus shifts.

Particles on the backside of a substrate can lead to problems at processing steps other than lithography, including ion implantation and plasma etching steps. In the case of ion implantation, a substrate is heated by an ion beam that is being used to introduce dopant into the substrate. This heat can cause the resist to reticulate and make removal of the resist during subsequent steps, such as a plasma ash resist strip, nearly impossible. Within a plasma etching chamber, the particles can be transferred from one substrate to another. Eventually, particles are transferred out of the equipment and placed into a piece of processing equipment that is sensitive to contamination, such as a diffusion furnace. Furthermore, backside particles on a substrate can lead to non-uniform etching of the substrate due to temperature gradients across the substrate surfaces.

Therefore, a need exists to reduce the amount of particles being introduced onto the backside of a substrate from a chuck, particularly when liquids are being dispensed onto the substrate. A need further exists to reduce the probability that the particles will permanently remain on the substrate, particularly for more complex process flows that have upwards of twenty-five masking steps.

DETAILED DESCRIPTION OF A PREFERRED EMBODIMENT

Figure 1:
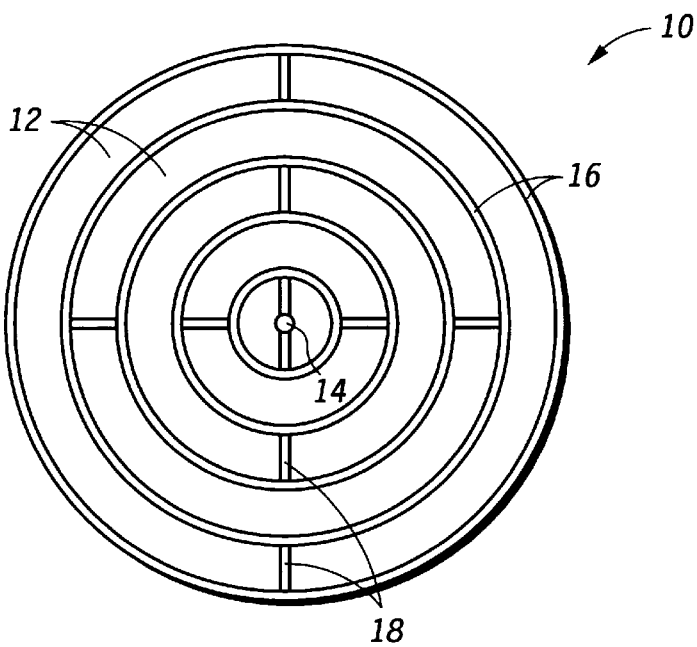
FIG. 1 includes an illustration of a top view of a prior art chuck used in a spin track for dispensing resist or developer.
Figure 2:
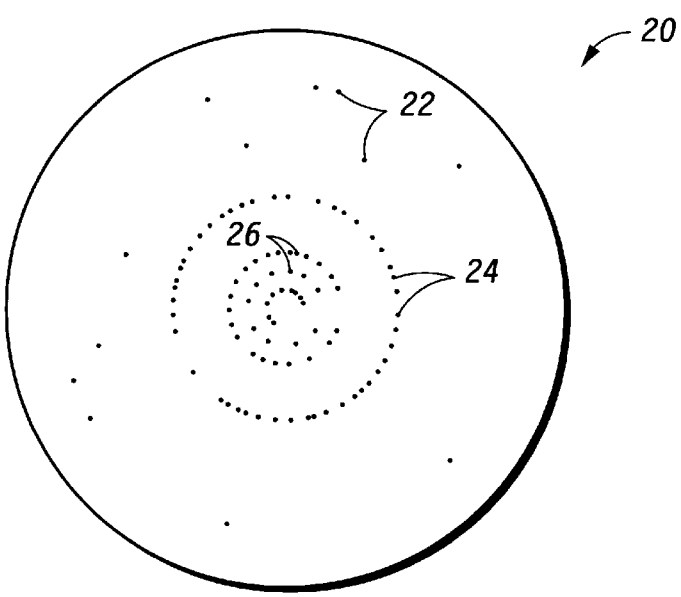
FIG. 2 includes an illustration of a bottom view of a substrate illustrating particles caused by contamination transferred from the chuck in FIG. 1.

Generally, the present invention is a method for reducing particles on the backside of a substrate, such as a semiconductor wafer or flat panel display, using a chuck cleaning process. A track system includes a chuck for processing substrates. Between processing substrates on the track system, a solvent is applied to the surface of the chuck to remove residual material that adheres to the surface of the chuck. After the chuck cleaning procedure, the chuck is dried, for example by spinning, and a new substrate is processed. This procedure can be used on different types of equipment, including resist coating tracks, resist developing tracks, spin-on glass coaters, ion implanters, steppers, and other imaging systems. By cleaning the chuck automatically, the amount of particles that cause defects on the substrate is reduced to help improve yield. Because the operation is automated, there should be no requirement for additional manpower. Furthermore, the chuck cleaning procedure can be integrated into the manufacturing process without adversely affecting the throughput of the systems.

These and other features, and advantages, will be more clearly understood from the following detailed description taken in conjunction with the accompanying FIGS. 3–6. It is important to point out that the illustrations are not necessarily drawn to scale, and that there are likely to be other embodiments of the present invention which are not specifically illustrated. Further, like reference numerals may be used through the various views to designate identical or corresponding parts.

Figure 3:
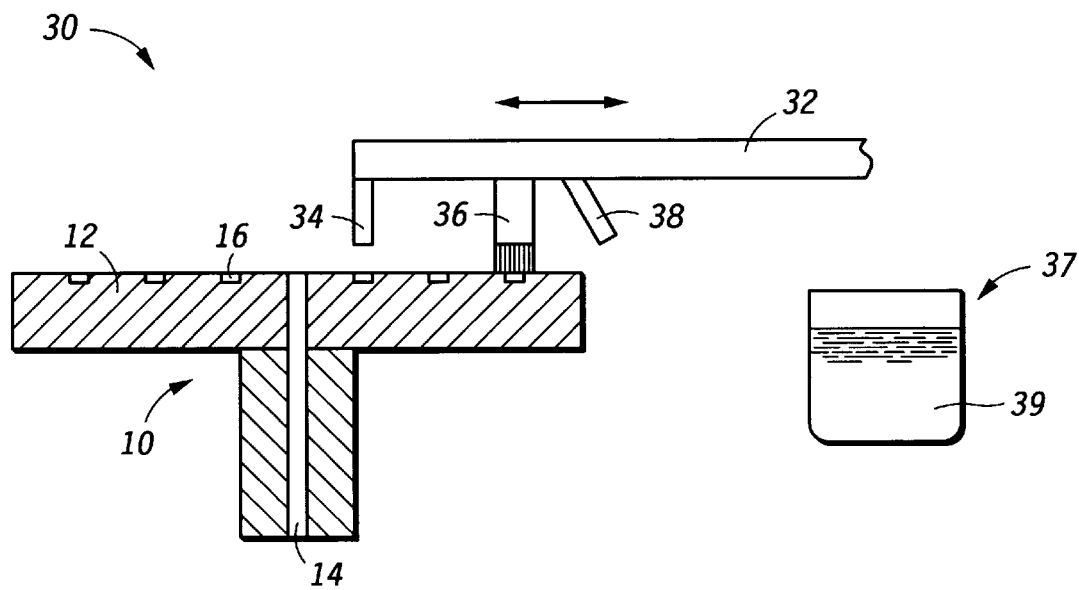
FIG. 3 includes an illustration of a cross-sectional view of a portion of a spin track system including a chuck and a mechanism used to clean the chuck in accordance with one embodiment of the present invention.

FIG. 3 includes an illustration of a cross-sectional view of a coating track system 30 including a substrate chuck 10. Substrate chuck 10 is similar to the one that is illustrated in FIG. 1, and includes raised portions 12 along with vacuum port 14 and vacuum channels 16. System 30 also has a dispense arm 32 that can be moved from side to side. A dispense nozzle 34, a brush 36, and an edge bead removal (EBR) nozzle 38 are attached to dispense arm 32. A resist material can be introduced onto a substrate (not shown in FIG. 3) by dispense nozzle 34 for coating the resist material onto the substrate. System 30 also includes an idle bath 37 that has a solvent 39 that is used to dissolve any residual material that remains on the end of the dispense nozzle 34 or between bristles of brush 36. EBR nozzle 38 is used to dispense a solvent, such as a ketone, an ether, an acetate, an aliphatic hydrocarbon, or other organic solvent.

Figure 4:
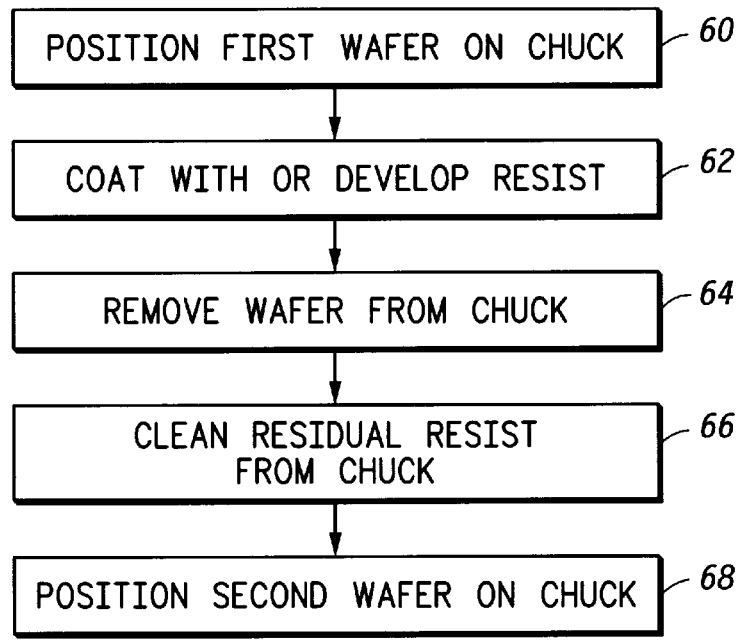
FIG. 4 includes a process flow diagram in accordance with an embodiment of the present invention.

FIG. 4 includes a process flow diagram in using coating system 30. A substrate is positioned onto the chuck 10 as shown in a step 60. The substrate can be one of any number of different substrate materials wherein backside particles pose manufacturing processes, including a monocrystalline semiconductor wafer, a semiconductor on insulator substrate, another substrate used for forming semiconductor devices, flat panel displays, or other types of substrates where alignment and planarity during processing of the substrate are critical, for instance in lithography steps. After the substrate is positioned on the chuck, vacuum is applied, and a resist layer is coated onto the substrate as shown in a step 62. After coating, vacuum is released and the substrate is removed from the chuck in a step 64.

In accordance with one embodiment of the present invention, the chuck is then cleaned in a step 66 to remove any residual resist that lies on the surfaces of the chuck and that could come into contact with the next substrate mounted on the chuck as a result of a step 68. Although some processing parameters for the cleaning step are herein presented, these parameters are not meant to be limiting, but only illustrative of some of the many options that can be used in practicing the invention. In one embodiment, cleaning is performed by dispensing a solvent onto the chuck, and spinning the chuck either during or after the solvent dispense. Before dispensing any of the solvent, the vacuum port 14 is adjusted so that positive pressure is being applied to the vacuum port to reduce the likelihood of any back flow of the solvent material into the vacuum lines that could cause damage to the vacuum pumps. During the cleaning process, a resist solvent will preferably be dispensed through the EBR nozzle 38. Generally, solvents of the families of ketones, ethers, acetates, and aliphatic hydrocarbons, or other organic solvents are suitable for use in cleaning the chuck in a resist coater application. In one particular embodiment, EGMEA (ethylene glycol monoethyl ether acetate) or PGMEA (propylene glycol monomethyl ether acetate) are dispensed to the clean the chuck, both of which are chemicals commonly used in edge bead removal processes. Ethyl lactate or EEP (2-methoxy propionate) can alternatively be used.

The solvent can be dispensed in a number of different ways. In one particular embodiment, chuck 10 is rotated at a speed in a range of approximately 50 to 300 revolutions per minute during dispense of the solvent. After a sufficient volume of solvent is dispensed, the flow is terminated and the chuck is spun at a higher speed, e.g. in excess of 1000 revolutions per minute, to dry the chuck before the next substrate is placed onto the chuck. Another option includes using a puddle flow, similar to conventional puddle development. For example, the solvent could be placed onto chuck 10 such that enough of the solvent is present on the chuck that it actually overflows the chuck surface. In still another alternative embodiment, a drying nozzle (not shown in FIG. 3) is used to aid the chuck in the spin drying step to further increase the likelihood that the chuck will be dry. The drying nozzle could flow filtered nitrogen, air, or some other relatively inert gas. If additional drying is needed, the drying nozzle could introduce a heated gas such as heated air or heated nitrogen onto chuck 10 during the high speed spinning operation. If using a heated gas flow, the temperature of the chuck should be monitored and adjusted as needed if using the chuck in a temperature sensitive process such as resist coat.

The cleaning can be used between each substrate processed on chuck 10, or more periodically, such as between each lot of substrate (wherein a lot may be anywhere from thirteen to twenty-five substrates). Less periodically, for example between critical lots or between shifts in a manufacturing facility, brush 36 can be used to remove residual material that is not readily dissolved when using the EBR nozzle 38 as previously described. The brush 36 is soaked in the solvent 39 when it is not in use. Use of brush 36 allows mechanical action from the actual brushing to be used to help clean the chuck of residual material that is difficult to dissolve, as well has harder particles such as chipped portions of the substrate itself.

In addition to having brush 36 within the idle bath 37, system 30 is preferably configured such that the dispense nozzle 34 overlies the solvent 39, such that nozzle 34 resides within saturated vapors overlying from the solvent 39. The liquid being dispensed through the EBR nozzle 38 and the solvent 39 can be the same fluid.

Many different embodiments exist for adapting the present invention to a wide variety of other types of processing steps. Although the previous description is related to a resist coating system, the present invention can be extended to coating other materials, such as spin-on glass (SOG) and other materials that are dispensed as a liquid or sol-gel solution over a substrate. In a specific embodiment for SOGs, the EBR nozzle 38 is modified to flow an oxide solvent such as hydrofluoric acid and buffered oxide etchants, or a carrier solvent with the SOG. In another embodiment, the present invention can be modified for use in a developing track system, as further explained below. With a developing track system, the EBR nozzle flows a developer solution to help further remove resist material that is adhered to the chuck.

Further, the present invention can be extended to other pieces of equipment that also have chucks. These include lithographic systems, such as steppers and projection aligners, spin coaters (e.g. as used to coat substrates with SOG), and plasma etch systems, or even ion implantation systems. In the case of a lithographic system, the apparatus may need to be slightly modified to prevent any of the cleaning solvents from reaching the optics used to define patterns within that system. However, these issues can be resolved by modifying the system so that solvent vapors are exhausted from the systems before reaching the optics, shielding the chuck cleaning portion from the rest of the system to reduce the likelihood that the solvents get near the optical lenses.

The brush 36 can be replaced by a sponge or some other object that may be used to scrub the surface of the chuck. The brush, sponge, or other objects should be made of materials which do not dissolve in either the solvent being ejected from the EBR nozzle 38 or within the idle bath 37. Further, the mechanical scrubbing will wear on the material, and therefore, the brush or sponge needs to be resistant to some mechanical abrasion. The material also should not damage, scratch, or otherwise change the shape or topography of the chuck.

Figure 5:
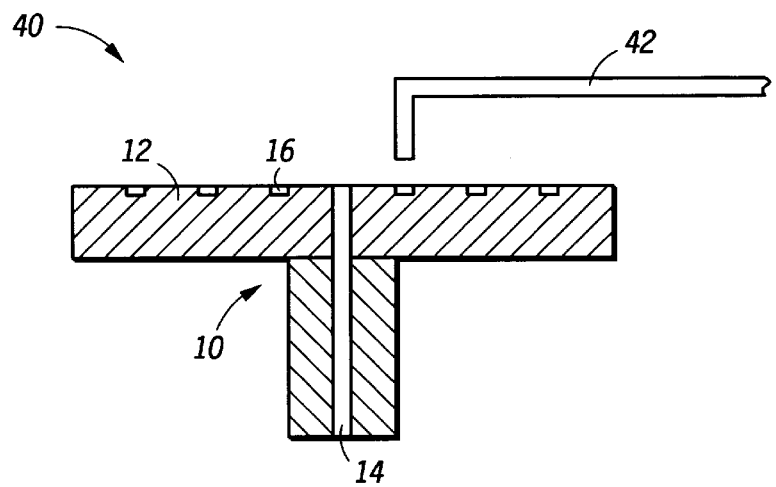
FIG. 5 includes an illustration of a cross-sectional view of a spin track that uses a fiber optic cable in accordance with another embodiment of the present invention.

FIG. 5 includes a system 50 that is used in a developing track system. A fiber optic cable 42 scans the surface of the chuck 10 as it rotates to expose any remaining resist that has been transferred onto that chuck from substrates. Following the exposure with the fiber optic cable 42, a developing solution, generally a base having a hydroxyl group, is then introduced onto chuck 10 to remove the exposed resist. One advantage of the fiber optic cable 42 is that the frequency of the radiation emitted from the fiber optic cable can be tuned for the specific wavelength used to expose the resist material. For example, if the resist material is photoresist, light is used in the fiber optic cable. If an ultraviolet resist is used, then the fiber optic cable emits ultraviolet radiation. The fiber optic system can be used in the resist coating systems, also.

Figure 6:
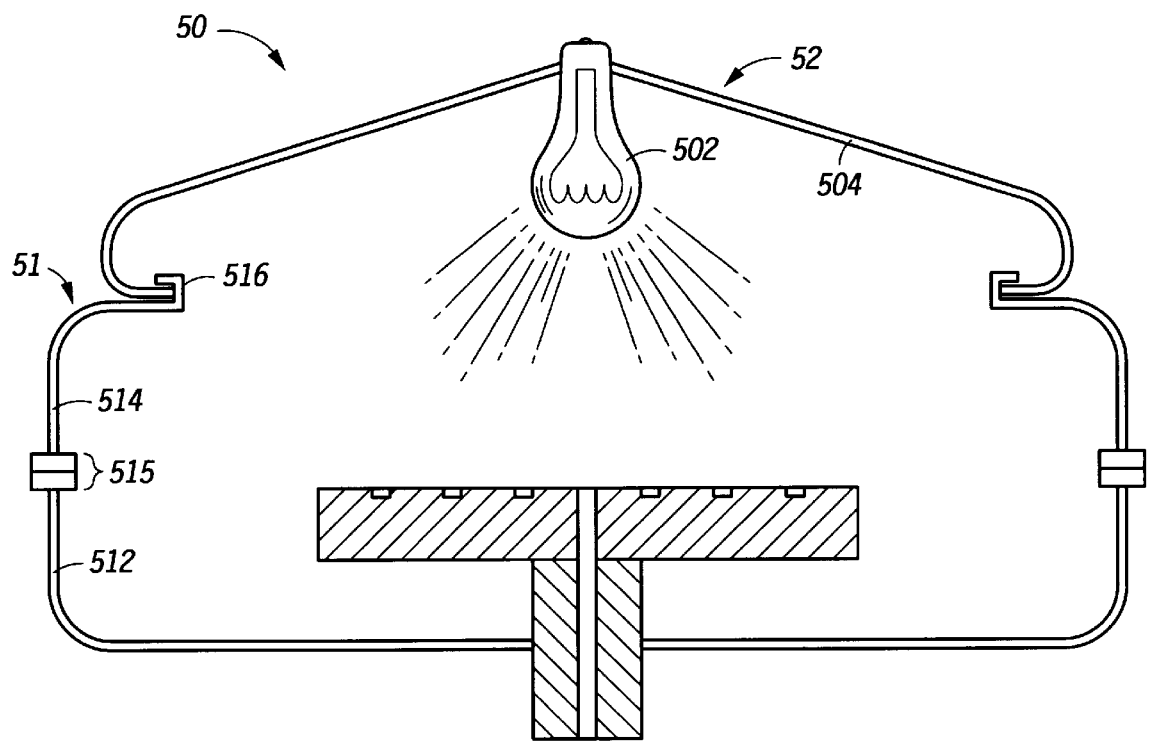
FIG. 6 includes an illustration of a cross-sectional view of a portion of a spinner cup used for resist coating in which a flood exposure of both the chuck and the walls of the spinning cup are exposed to a radiation source in accordance with another embodiment of the present invention.

In still another embodiment, a flood exposing system could be used as illustrated in FIG. 6. A resist coating system 50 includes a spinner cup 51 that has a lower portion 512 and an upper portion 514. These two portions are clamped together at flanges 515. Near the top of the upper portion 514 is a rim 516. Resist coating system 50 includes a radiating apparatus 52 which is attached to the spinner cup 51 at the rim 516. The radiating apparatus 52 includes a radiation source 502 and a reflector 504. The radiation source 502 is selected to match the radiation wavelength used to expose the resist. For photoresist, the radiation source 502 could be as simple as a light bulb or a mercury lamp. If an ultraviolet resist is used, the radiation source should be a ultraviolet radiation source. This particular embodiment is useful for exposing resist within a spinner cup. More particularly, the spinner cup 51 is typically made of a white translucent material such as Teflon. Radiation from the radiation source 502 reflects off the walls of the spinner cup 51 so that light is reflected onto all surfaces of the cup walls to expose portions of the spinner cup that would otherwise accumulate resist. Following the exposures, the radiating apparatus 52 is removed, and a dispense arm that is fitted with a developer solvent is positioned to liberally spray the chuck and remove the resist from the walls of the spinner cup 51. This allows the buildup of resist within the spinner cup to be kept relatively low in comparison to prior art methods.

The present invention has many advantages over prior art methods for reducing particles on the backsides of substrates. First, the chucks are kept reasonably clean to reduce the likelihood of residual contaminants being transferred from the chuck onto the backsides of substrates. More process margin at lithography steps and a reduced risk of contamination are expected in practicing the invention, particularly for larger substrates (e.g. wafers having a diameter of 300 millimeters or larger) and for substrates having critical dimensions of less than or equal to 0.25 $\mu$m. Another advantage of the embodiments of the present invention is the integration into a process flow without causing additional overhead in processing substrates. For example, the chuck cleaning step can be performed while a substrate is on a heating plate used to soft-bake a resist layer or SOG layer. The soft bake steps are usually performed to drive out some of the solvents that are within the layer during the coating. Typically, the soft bake limits the throughput for a coating track system. The chuck cleaning steps of the present invention are integrated to be performed while the soft bake occurs.

Another advantage of the embodiments of the present invention is not having to use special or unusual material handling methods. For example, a coating track can be modified so that a solvent for the coated material is introduced into the spinner cup. In the case of resist, a solvent is typically used for EBR anyway. Therefore, there is no additional plumbing or new chemicals required that currently are not already plumbed into the track system. Another advantage of the present invention is that it can be performed without having to incorporate marginal processing steps. Because the operation is performed between substrates, process parameters can be tailored for a specific process to what works best for the equipment used. The embodiments of the present invention should help to improve yield by reducing the amount of defects that are introduced onto a substrate. The cleaning methods that have been previously described can be performed such that some or all of the cleaning procedures are done between individual substrates, between lots of substrates, at a shift change, or other times when it becomes reasonably necessary to clean the chuck. The cleaning is performed by the system and needs no human intervention.

Thus it is apparent that there has been provided, in accordance with the invention, a method for reducing particles from a substrate which utilized chuck cleaning that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to the particular solvents or chemicals specifically mentioned for cleaning the chuck. In addition, the invention is not limited to the particular spin coating processes for semiconductor devices herein described. For instance, the invention can be used in any spin-coating process where it is advantageous to clean the chuck periodically. It is also important to note that the present invention is not limited in any way to the particular coating materials herein mentioned. Other polymers, including polyimides and the like, can be coated using a chuck in accordance with the invention. Furthermore, the invention is not limited to a coating process for a substrate. A substrate cleaning process, wherein residual films or deposits form on the chuck surface, can also benefit from the present invention. Therefore, it is intended that this invention encompass all such variations and modifications as fall within the scope of the appended claims.

We claim:

1. A method for reducing particles on a substrate comprising the steps of:
   providing a piece of manufacturing equipment having a chuck and a chuck cleaning element;
   providing a first substrate;
   positioning the first substrate on the chuck;
   performing a manufacturing operation on the first substrate using the piece of manufacturing equipment while the first substrate is positioned on the chuck;
   removing the first substrate from the chuck;
   cleaning the chuck with the chuck cleaning element;
   providing a second substrate; and
   positioning the second substrate on the chuck.

2. The method of claim 1 wherein the step of providing a piece of manufacturing equipment comprises providing of a track system.

3. The method of claim 2 wherein the step of providing a piece of manufacturing equipment comprises providing a resist coater track and wherein the step of performing a manufacturing operation comprises coating the first substrate with a resist.

4. The method of claim 3 wherein the step of cleaning comprises cleaning the chuck with a chemical selected from a group consisting of a ketone, an ether, an acetate, and an aliphatic hydrocarbon.

5. The method of claim 2 wherein the step of providing a piece of manufacturing equipment comprises providing a resist developer track and wherein the step of performing a manufacturing operation comprises developing a resist which has been deposited on the first substrate.

6. The method of claim 5 wherein the step of cleaning comprises cleaning the chuck with a base.

7. The method of claim 2 wherein the step of providing a piece of manufacturing equipment comprises providing a spin coater.

8. The method of claim 1 wherein the step of providing a piece of manufacturing equipment comprises providing a piece of lithographic equipment.

9. The method of claim 1 wherein the step of providing a piece of manufacturing equipment comprises providing a piece of manufacturing equipment wherein the chuck cleaning element comprises a nozzle for dispensing a cleaning fluid.

10. The method of claim 9 wherein the step of cleaning the chuck comprises dispensing the cleaning fluid on the chuck and spinning the chuck either simultaneously with the step of dispensing or after the step of dispensing.

11. The method of claim 1 wherein the step of providing a piece of manufacturing equipment comprises providing a piece of manufacturing equipment wherein the chuck cleaning element comprises an element selected from a group consisting of a sponge and a brush, and wherein the element is at least partially saturated with a cleaning fluid.

12. The method of claim 1 wherein the step of providing a substrate comprises providing a substrate selected from a group consisting of a semiconductor wafer and a flat panel display.

13. A method for reducing particles on a substrate comprising the steps of:
   providing a first semiconductor substrate having a surface;
   providing a substrate handling system for use in conjunction with a semiconductor substrate manufacturing operation, wherein the substrate handling system comprises a chuck and a chuck cleaner;
   positioning the first semiconductor substrate on the chuck such that the surface of the first semiconductor substrate is in contact with the chuck;
   subjecting the first semiconductor substrate to the semiconductor substrate manufacturing operation while the surface of the first semiconductor substrate remains in contact with the chuck;
   removing the first semiconductor substrate from the chuck;
   using the substrate handling system to clean the chuck with the chuck cleaner;
   providing a second semiconductor substrate; and
   positioning the second semiconductor substrate on the chuck.

14. The method of claim 13 wherein the steps of providing a first semiconductor substrate and providing a second semiconductor substrate comprise providing a semiconductor substrate selected from a group consisting of a semiconductor wafer and a flat panel display.

15. The method of claim 13 wherein the step of using comprises using the substrate handling system to dispense a cleaning fluid onto the chuck.

16. The method of claim 15 wherein the step of providing a substrate handling system comprises providing a substrate handling system wherein the chuck is a vacuum chuck having a vacuum port, and wherein during the step of subjecting, a vacuum is applied to the first semiconductor substrate using the vacuum port, and further comprising the step of introducing a gas through the vacuum port during the step of dispensing.

17. The method of claim 13 wherein the step of using comprises using the substrate handling system to clean with the chuck cleaner which is selected from a group consisting of a brush and a sponge, and wherein the chuck cleaner is moved across the chuck.

18. The method of claim 17 further comprising the step of at least partially immersing the chuck cleaner into a bath of cleaning fluid prior to the step of moving.

19. The method of claim 13 wherein the steps of providing a first semiconductor substrate and providing a second semiconductor substrate comprise providing a semiconductor wafer having a diameter of at least 300 millimeters.

20. A method for reducing particles on a substrate comprising the steps of:
   providing a first semiconductor substrate;
   providing a resist coater having a coater chuck with a vacuum port and having a coater chuck cleaning element;

positioning the first semiconductor substrate on the coater chuck;

applying vacuum to the first semiconductor substrate through the vacuum port of the coater chuck;

coating the first semiconductor substrate with a layer of resist;

releasing vacuum and removing the first semiconductor substrate from the coater chuck;

cleaning the coater chuck using the coater chuck cleaning element;

providing a second semiconductor substrate; and positioning the second semiconductor substrate on the coater chuck for coating the second semiconductor substrate with resist.

21. The method of claim 20 further comprising the steps of:

selectively exposing portions of the layer of resist to radiation; and patterning the layer of resist, wherein the step of patterning comprises:

providing a resist developer having a developer chuck and a developer chuck cleaning element;

positioning the first semiconductor substrate on the developer chuck of the resist developer;

developing the layer of resist;

removing the first semiconductor substrate from the developer chuck of the resist developers; and cleaning the developer chuck of the resist developer using the developer chuck cleaning element of the resist developer.

22. The method of claim 20 wherein the step of cleaning comprises cleaning the chuck with a chemical selected from a group consisting of: a ketone, an ether, an acetate, and an aliphatic hydrocarbon.

23. The method of claim 20 wherein the step of providing a first semiconductor substrate comprises providing a semiconductor wafer having a diameter of at least 300 millimeters.

24. A method for reducing particles on a substrate comprising the steps of:

providing a first semiconductor substrate having a layer of resist formed thereon;

selectively exposing portions of the layer of resist to radiation to form a pattern in the layer of resist;

providing a resist developer having a chuck with a vacuum port and having a chuck cleaning element;

positioning the first semiconductor substrate on the chuck;

applying vacuum to the first semiconductor substrate through the vacuum port of the chuck;

developing the pattern in the layer of resist on the first semiconductor substrate;

releasing vacuum and removing the first semiconductor substrate from the chuck;

cleaning the chuck using the chuck cleaning element;

providing a second semiconductor substrate; and positioning the second semiconductor substrate on the chuck for developing resist on the second semiconductor substrate.

25. The method of claim 24 wherein the step of cleaning comprises cleaning the chuck with a chemical which is a base having a hydroxyl group.

26. The method of claim 24 wherein the cleaning element comprises a radiation source and wherein the step of cleaning the chuck comprises exposing the chuck to radiation having a range of wavelengths, wherein the range is a same range as that used to expose the resist.

27. The method of claim 24 wherein:

positioning the first semiconductor substrate on the chuck positions the first semiconductor substrate on a surface of the chuck; and cleaning the chuck cleans the surface of the chuck.

28. The method of claim 1 wherein:

positioning the first substrate on the chuck positions the first substrate on a surface of the chuck; and cleaning the chuck cleans the surface of the chuck.

29. The method of claim 13, wherein:

positioning the first semiconductor substrate on the chuck positions the first semiconductor substrate on a surface of the chuck; and using the substrate handling system cleans the surface of the chuck.

* * * * *